United States Patent [19]

Bazes

[11] Patent Number: 5,714,907
[45] Date of Patent: Feb. 3, 1998

[54] APPARATUS FOR PROVIDING DIGITALLY-ADJUSTABLE FLOATING MOS CAPACITANCE

[75] Inventor: Mel Bazes, Haifa, Israel

[73] Assignee: Intel Corporation, Santa Clara, Calif.

[21] Appl. No.: 687,960

[22] Filed: Jul. 29, 1996

[51] Int. Cl.$^6$ .................................................. H01L 27/08
[52] U.S. Cl. ....................... 327/581; 327/365; 327/524; 327/554; 327/403
[58] Field of Search ........................... 327/524, 336, 327/365, 437, 552, 263, 581, 271, 284, 277, 403, 404

[56] References Cited

U.S. PATENT DOCUMENTS

| | | | |
|---|---|---|---|
| 3,745,383 | 7/1973 | Sangster | 307/293 |
| 4,453,090 | 6/1984 | Sempel | 327/524 |
| 4,837,466 | 6/1989 | Kanauchi | 307/605 |
| 4,975,605 | 12/1990 | Bazes | 307/606 |
| 4,994,695 | 2/1991 | Bazes | 307/603 |
| 5,012,142 | 4/1991 | Sonntag | 307/602 |
| 5,051,629 | 9/1991 | Hopkins | 307/603 |
| 5,130,564 | 7/1992 | Sin | 307/246 |
| 5,258,659 | 11/1993 | Kannegundla | 307/268 |
| 5,283,631 | 2/1994 | Koerner | 327/393 |
| 5,365,128 | 11/1994 | Bazes | 327/141 |
| 5,416,436 | 5/1995 | Rainard | 327/270 |

FOREIGN PATENT DOCUMENTS

| | | | |
|---|---|---|---|
| 4207521 | 7/1992 | Japan | 327/285 |
| 4354141 | 12/1992 | Japan | 327/284 |

OTHER PUBLICATIONS

"A Novel CMOS Digital Clock and Data Decoder", Mel Bazes & Roni Ashuri, *IEEE Journal of Solid–State Circuits*, vol. 27, No. 12, Dec. 1992, pp. 1934–1940.

*Primary Examiner*—Timothy P. Callahan
*Assistant Examiner*—Dinh Le
*Attorney, Agent, or Firm*—Blakely, Sokoloff, Taylor & Zafman

[57] ABSTRACT

A method and an apparatus for providing an adjustable floating capacitance between a first node and a second node in an integrated circuit. First and second transistors having commonly coupled gates are coupled between the input and output nodes of a digitally-adjustable floating MOS capacitor. The source and drain of the first transistor are coupled to the input node, while the source and drain of the second transistor are coupled to the output node. A switch responsive to an enable signal is coupled to the gates of the first and second transistors. In response to the enable signal, the switch alternatively couples the gates of the first and second transistors to either a first potential or a second potential. When the gates of the first and second transistors are coupled to the first potential, a first capacitance is realized between the input and output nodes. When the gates of the first and second transistors are coupled to the second potential, a second capacitance is realized between the first and second nodes.

20 Claims, 6 Drawing Sheets

FIG. 2 *(PRIOR ART)*

APPARATUS FOR PROVIDING DIGITALLY-ADJUSTABLE FLOATING MOS CAPACITANCE

BACKGROUND OF THE INVENTION

1. Field of the Invention

The present invention relates generally to integrated circuits and more specifically, the present invention relates to integrated circuits that provide capacitance.

2. Description of the Related Art

Capacitive devices may serve a countless number of uses which include being used in implementing adjustable active filters, such as those used in adaptive equalizers, or the like. Such applications require the implementation of floating capacitors. In particular, a floating capacitor is a capacitor in which neither capacitor plate nor node is permanently coupled to a virtual ground, such as a supply voltage or ground voltage.

FIG. 1 illustrates an example in which an adjustable floating capacitor may be implemented in an active lead-lag filter 101. Lead-lag filter 101 is implemented with adjustable floating capacitor C which may be adjusted under digital control (not shown). That is, the capacitance of C may be digitally adjusted.

Lead-lag filter 101 of FIG. 1 has the transfer function:

$$H(s) = -\frac{1 + s/\omega_z}{1 + s/\omega_p}$$

where s is the complex frequency, H(s) is the transfer function, $\omega_z$ is the transfer function zero and is given by:

$$\omega_z = \frac{1}{(R1 + R2)C}$$

and $\omega_p$ is the transfer function pole and is given by:

$$\omega_p = \frac{1}{R2 \cdot C}$$

In order to adjust the transfer function zero $\omega_z$ and transfer function pole $\omega_p$ of lead-lag filter 101, the capacitance of capacitor C may be adjusted under digital control.

It is appreciated that lead-lag filter 101 of FIG. 1 is merely one example of how adjustable floating capacitors may be used. Any other application which requires an adjustable capacitance between two nodes of an integrated circuit may utilize an adjustable floating capacitor.

FIG. 2 is an example of one prior art adjustable floating capacitor 201. Adjustable floating capacitor 201 provides a digitally-adjustable capacitance between nodes IN 203 and OUT 205 in response to enable signals EN[0:N−1]. Adjustable floating capacitor 201 includes N parallel floating capacitors 213 implemented in a two-polysilicon-layer process. As shown in FIG. 2, each capacitor 213 may be switched individually in and out of adjustable floating capacitor 201. As also shown in FIG. 2, each capacitor 213 requires a series switch 209. In general, each series switch 209 is implemented using ordinary CMOS transmission gates. To increase capacitance between IN 203 and OUT 205, more switches 209 are closed. To decrease capacitance between IN 203 and OUT 205, more switches 209 are opened.

A problem with adjustable floating capacitor 201 is that the transmission gates used to implement each switch 209 introduce undesirable series resistance as well as parasitic capacitance. With the added unwanted resistance and parasitic capacitance, performance of adjustable floating capacitor 201 can be greatly degraded. Two polysilicon-layer MOS processes are generally expensive in comparison with ordinary single-polysilicon-layer CMOS processes, such as the conventional logic processes used in the fabrication of ordinary integrated circuit chips such as microprocessors.

Therefore, what is desired is a simple method and apparatus for coupling and decoupling floating capacitors from integrated circuits without the need for transmission gates in series with the capacitors or a two-polysilicon MOS process. Such a method and apparatus could be implemented using ordinary low cost single-polysilicon layer CMOS processes to reduce overall circuit costs. Such capacitors may be used in any application requiring the implementation of digitally-adjustable floating capacitors such as, for example, the active filter shown in FIG. 1.

SUMMARY OF THE INVENTION

An integrated circuit having an adjustable floating MOS capacitor is disclosed. In one embodiment, first and second transistors having commonly coupled gates are utilized with the drain and source of one of the transistors coupled to a first node and the drain and source of the other transistor coupled to a second node. An enable signal is coupled to the transistors such that the gates of the first and second transistors are alternately coupled to a first potential or a second potential in response to the enable signal such that the integrated circuit alternately provides a first capacitance or second capacitance between the first and second nodes in response to the enable signal. Additional features and benefits of the present invention will become apparent from the detailed description, figures and claims set forth below.

BRIEF DESCRIPTION OF THE DRAWINGS

The present invention is illustrated by way of example and not limitation in the accompanying figures.

DETAILED DESCRIPTION

A method and an apparatus for providing an adjustable floating capacitance between a first node and a second node in an integrated circuit is disclosed. In the following description, numerous specific details are set forth such as example schematics in order to provide a thorough understanding of the present invention. It will be apparent, however, to one having ordinary skill in the art that the specific details need not be employed to practice the present invention. In other instances, well known materials or methods have not been described in order to avoid obscuring the present invention.

Figure 3:
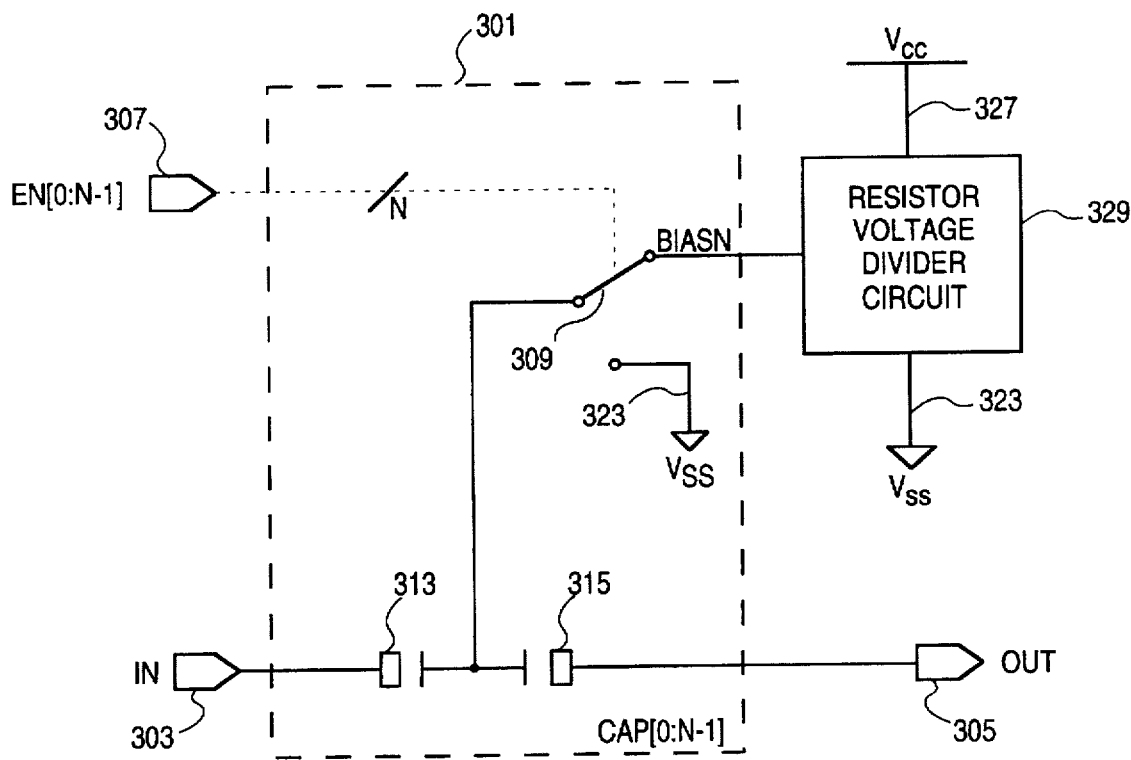
FIG. 3 is a schematic of a digitally-controlled adjustable floating capacitor in accordance with the teachings of the present invention.

FIG. 3 shows a digitally-controlled adjustable floating MOS capacitor 301 in accordance with the teachings of the present invention. Capacitor 301 provides an adjustable capacitance between nodes IN 303 and OUT 305. The capacitance between IN 305 and OUT 305 is adjusted in response to enable signals 307, also referred to as EN[0:N−1] in FIG. 3. Capacitor 301 includes transistors 313 and 315 having commonly coupled gates. The drain and source of transistor 313 are coupled to node IN 303 and the drain and source of transistor 315 are coupled to node OUT 305. Switch 309 is coupled to the gates of transistors 313 and 315 and alternatively couples the gates of transistors 313 and 315 to either $V_{SS}$ 323 or BIASN 321 in response to enable signals 307. BIASN 321 is provided by resistor voltage divider circuit 329 which is coupled between $V_{CC}$ 327 and $V_{SS}$ 323.

It is appreciated that digitally-adjustable floating MOS capacitor 301 of FIG. 3 is one of N floating capacitors, CAP[0:N−1], coupled in parallel. All N inputs of CAP[0:N−1] are coupled to input IN 303, while all N outputs of CAP[0:N−1] are coupled together to output node OUT 305. Each floating capacitor of CAP[0:N−1] includes the two MOS devices, transistors 313 and 315, coupled as capacitors. In one embodiment, each of the MOS devices transistors 313 and 315 have the same shape and area. Accordingly, transistors 313 and 315 have the same or nearly the same capacitance. To increase capacitance between IN 303 and OUT 305, more switches 309 are coupled to BIASN 321. To decrease capacitance between IN 303 and OUT 305, more switches 309 are coupled to $V_{SS}$ 323.

In normal operation, the DC bias voltages at input node IN 303 and at output node OUT 305 are approximately $V_{CC}/2$, and the voltages at node IN 303 and at node OUT 305 fluctuate with an amplitude that is well under $V_{CC}/2$. As will be described in greater detail below, the embodiment shown in FIG. 3 employs n-channel transistors for transistors 313 and 315. Thus, minimal capacitance is provided by transistors 313 and 315 when switch 309 is coupled to $V_{SS}$ 323 since in this case both transistors are biased in their cutoff regions, where no conducting layer exists under their respective gates. The lack of a conducting layer is equivalent to the lack of a lower capacitor plate resulting in minimal capacitance. Maximum capacitance is realized with transistors 313 and 315 when switch 309 is coupled to BIASN 321 since in this case both transistors are biased in their inversion regions where a conducting layer exists under their respective gates. The conducting layers are effectively the lower capacitor plates of each respective capacitor thereby resulting in maximum capacitance. In one embodiment, the potential provided at BIASN 321 is selected to be as high as possible in order to ensure that transistors 313 and 315 are biased with good margin within their inversion regions.

It is appreciated that although n-channel transistors are utilized for transistors 313 and 315, p-channel transistors may also be used. In such an embodiment, switch 309 would alternatively couple the gates of transistor 313 and 315 to $V_{CC}$ 327 or a bias voltage selected in order to ensure that the p-channel transistors are biased with a good margin within their respective inversion regions.

To clarify, a transistor in a CMOS circuit operates generally in either inversion or cutoff. When the transistor operates in inversion, a conducting layer is formed under the gate of the transistor and acts as the bottom plate of the capacitor. When the transistor operates in cutoff, no conductive layer is formed under the gate of the transistor effectively removing the bottom plate of the capacitor and greatly reducing capacitance.

In one embodiment, series-coupled resistors are utilized to implement resistor voltage divider circuit 329. Accordingly, the voltage potential provided at BIASN 321 is a high-impedance bias voltage. The high impedance bias voltage is necessary in order that the gates of the coupled n-channel transistors 313 and 315 are not loaded by the resistor voltage divider circuit 329. Significant loading would interfere with the proper operation of the present invention by diverting a signal flowing through the series-coupled n-channel transistors 313 and 315 to the resistor voltage divider circuit 329. Thus the resistors utilized in one embodiment of the present invention in resistor voltage divider circuit 329 are made large enough to lower the loading of the series-coupled n-channel transistors 313 and 315 to an insignificant amount.

Figure 4:
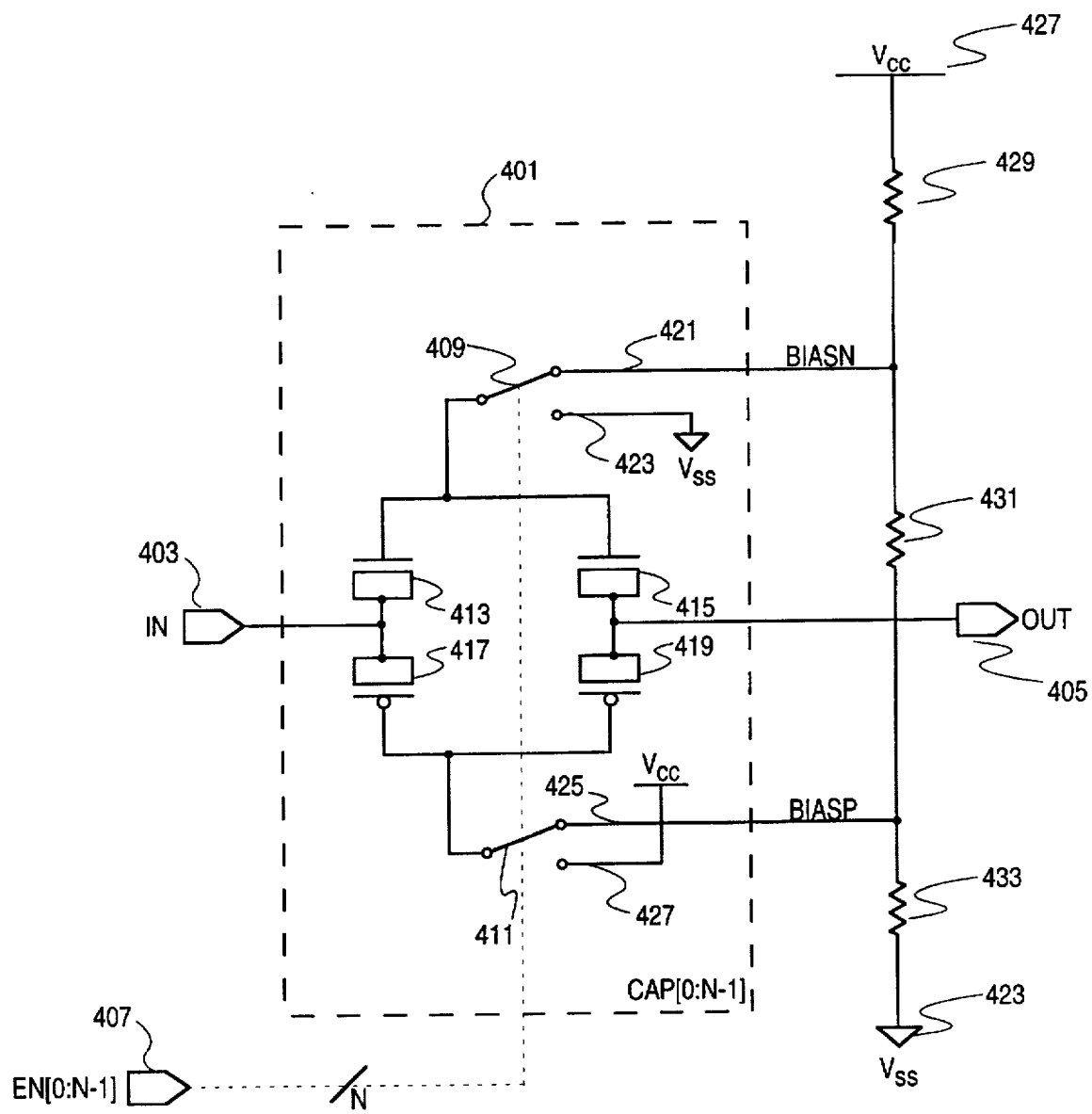
FIG. 4 is a schematic of another embodiment of a digitally-controlled adjustable floating capacitor in accordance with the teachings of the present invention.

FIG. 4 is a schematic illustrating another embodiment of the present invention consisting of N floating capacitors, CAP[0:N−1], coupled in parallel. All N inputs of CAP[0:N−1] are coupled together to input node IN 403, while all N outputs of CAP[0:N−1] are coupled together to output node OUT 405. In the embodiment shown in FIG. 4, each floating capacitor consists of 4 MOS devices coupled as capacitors, transistors 413, 415, 417 and 419. In one embodiment, all four MOS devices, transistors 413, 415, 417 and 419, have the same shape and area. Therefore, each of the MOS devices have the same or nearly the same capacitance.

As shown in FIG. 4, adjustable floating capacitor 401 includes n-channel transistors 413 and 415 having commonly coupled gates. The drain and source of n-channel transistor 413 are coupled to input node IN 403. The drain and source of n-channel transistor 415 are coupled to output node OUT 405.

Similarly, adjustable floating MOS capacitor 401 also includes p-channel transistors 417 and 419 having commonly coupled gates. The source and drain of p-channel transistor 417 are coupled to input node IN 403. The source and drain of p-channel transistor 419 are coupled to output node OUT 405.

Switch 409 is coupled to the gates of n-channel transistors 413 and 415 while switch 411 is coupled to the gates of p-channel transistors 417 and 419. Both switches 409 and 411 switch together in response to enable signals 407, also referred to as EN[O:N−1] in FIG. 4. In response to one of the enable signals 407, switch 409 alternatively couples the gates of n-channel transistors 413 and 415 to either BIASN 421 or $V_{SS}$ 423. Similarly, switch 411 alternatively couples the gates of p-channel transistors 417 and 419 to either BIASP 425 or $V_{CC}$ 427 in response to the one of the enable signals 407.

As shown in FIG. 4, a resistor voltage divider circuit including series coupled resistors 429, 431 and 433 is coupled between $V_{CC}$ 427 and $V_{SS}$ 423. The potentials at BIASN 421 and BIASP 425 are provided by the resistor voltage divider circuit. In the embodiment, the potentials selected for BIASN 421 and BIASP 425 are close to the supply voltages. To increase capacitance between IN 403 and OUT 405, more switches 409 and 411 are coupled to BIASN 421 and BIASP 425, respectively. To decrease capacitance between IN 403 and OUT 405, more switches are coupled to $V_{SS}$ 423 and $V_{CC}$ 427, respectively.

Figure 1:
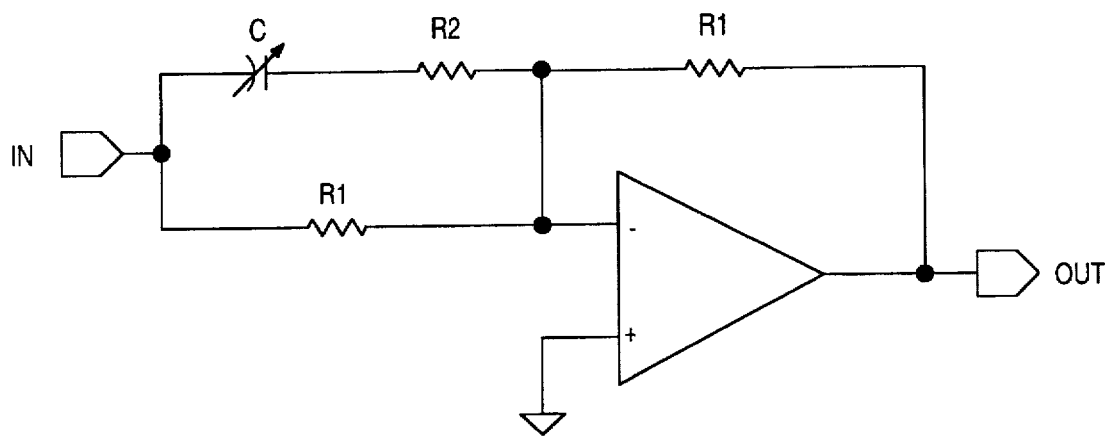
FIG. 1 is a schematic of a prior art active lead-lag filter utilizing an adjustable floating capacitor.
Figure 2:
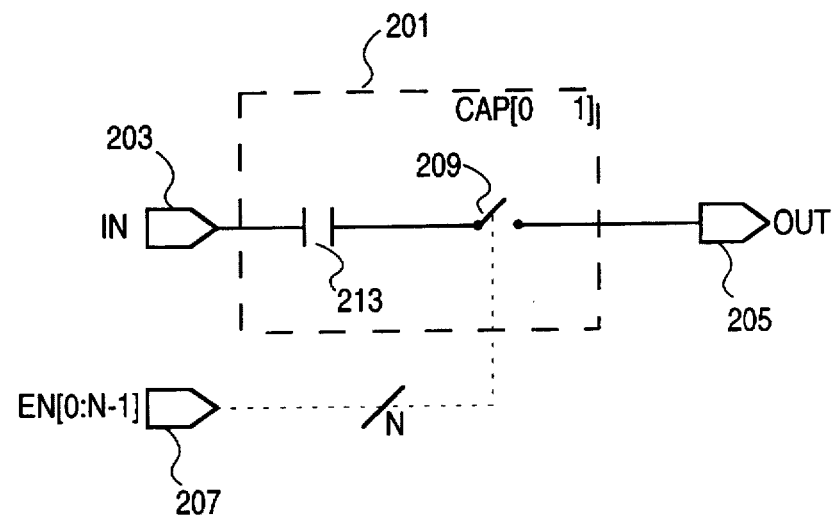
FIG. 2 is a schematic of a prior art digitally-adjustable floating capacitor.

It is appreciated that the resistor voltage divider circuit shown in FIG. 4 may be implemented using any convenient processing layer. For example, one implementation may utilize n-well diffusion for the described resistors while another embodiment may use polysilicon. It is also appreciated that the elements utilized in digitally-adjustable floating MOS capacitor 401 may be realized using a single-polysilicon-layer CMOS process unlike the adjustable floating capacitor 201 shown in FIG. 2 which is implemented using a relatively expensive two-polysilicon-layer MOS process. Therefore, the present invention provides an overall cost savings over the prior art adjustable floating MOS capacitor shown in FIG. 2 since a less expensive single-polysilicon-layer CMOS process may be used instead of the more expensive two-polysilicon-layer MOS process.

The gates of the individual transistors 413, 415, 417 and 419 in each particular adjustable floating MOS capacitor, for example, CAP[M], are switched under control of one of the enable signals 407, for example EN[M]. In this example, CAP[M] may be any one of capacitors CAP[0:N−1] and EN[M] is the corresponding enable signal of EN[0:N−1]. When EN[M] is high, the gates of n-channel transistors 413 and 415 in CAP[M] are coupled to node BIASN 421, while the gates of p-channel transistors 417 and 419 in CAP[M] are coupled to node BIASP 425. With the potentials at input node IN 403 and at output node OUT 405 at approximately $V_{CC}/2$ as discussed above, the potentials across transistors 413, 415, 417 and 419 are well within the threshold voltage ranges of each of the respective devices, and the devices are all therefore in inversion regions of MOS device operation. As a result, a low-resistance conducting layer forms under their respective gates. In this condition, their capacitance is maximum.

If, for example, EN[M] is low, the gates of n-channel transistors 413 and 415 in CAP[M] are coupled to $V_{SS}$ 423, while the gates of p-channel transistors 417 and 419 in CAP[M] are coupled to $V_{CC}$ 427. As a result, transistors 413, 415, 417 and 419 are therefore in cutoff, in which case no low-resistance conducting layer exists under the respective gates. In this condition, their effective capacitance is minimum. Therefore, by switching EN[M], the capacitance of floating capacitor CAP[M] can be modulated between discrete levels—high and low.

In one embodiment, the potentials at nodes BIASN 421 and BIASP 425 are selected to be as extreme as possible in order to ensure that the transistors 413, 415, 417 and 419 are biased with good margin within their respective inversion regions. However, the potentials at BIASN 421 and BIASP 425 are not biased to be so close to the voltage supply rails such that large fluctuations in input node IN 403 about $V_{CC}/2$ would cause the potentials at nodes BIASN 421 and BIASP 425 to be forced excessively beyond the voltage supply rails. If the potentials at BIASN 421 and BIASP 425 were forced beyond the voltage supply rails, the normally back-biased parasitic diodes that may be present at nodes BIASN 421 and BIASP 425 could potentially be forced to become forward-biased and, perhaps, trigger a latch up condition.

Figure 5:
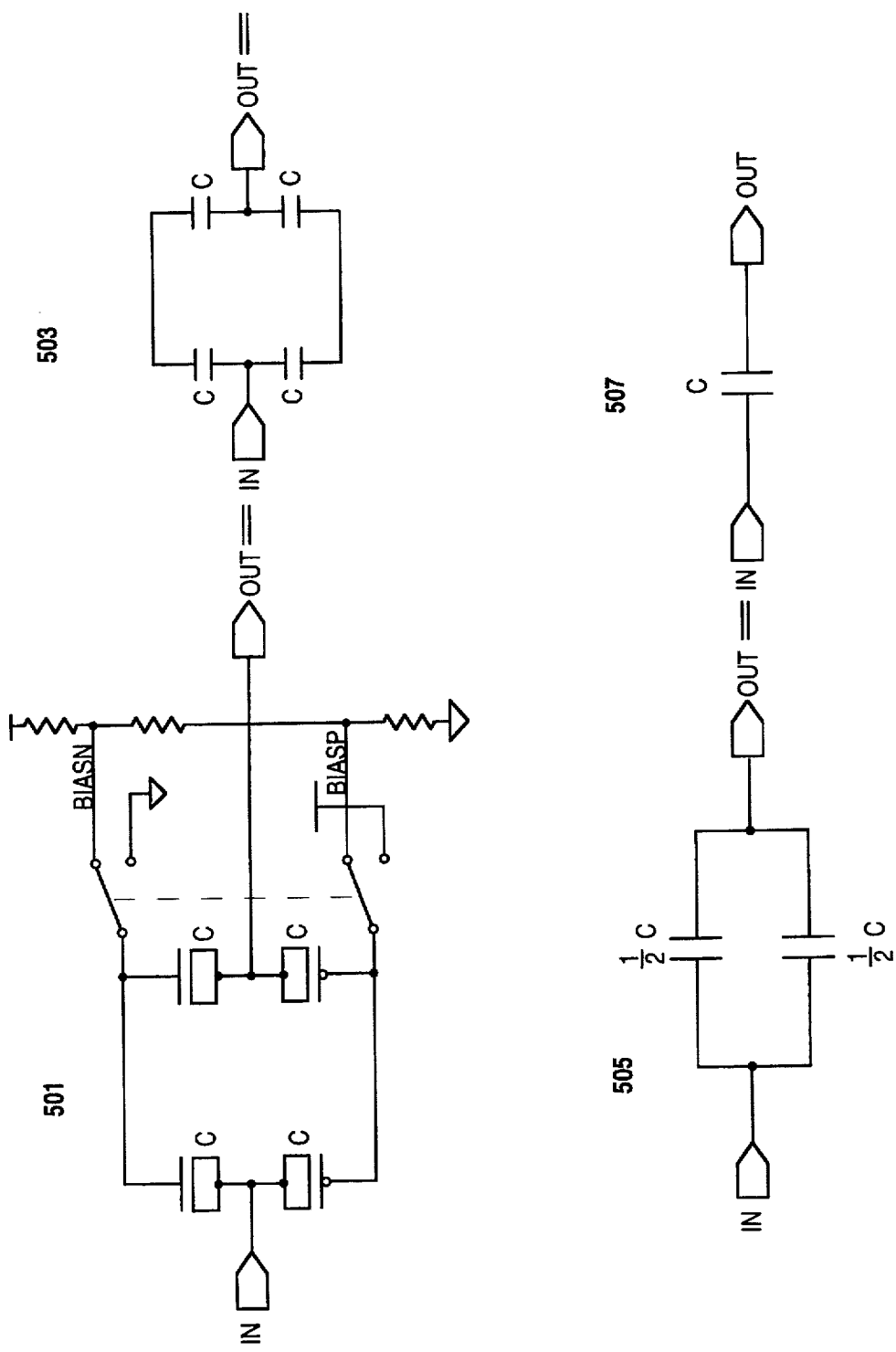
FIG. 5 is an illustration representing a number of integrated circuit schematics having equivalent effective capacitance.

In one embodiment, the capacitance of each transistor 413, 415, 417 and 419 is selected to have the same capacitance of C. Accordingly, the effective capacitance of each floating capacitor CAP[M] is also C, as shown in FIG. 5. FIG. 5 shows four different capacitive networks 501, 503, 505 and 507, wherein each integrated circuit shown has an effective capacitance equal to C. Therefore, if the capacitance of each transistor 413, 415, 417 and 419 in FIG. 4 is C, then the floating capacitor equivalent circuit is a single capacitor of capacitance equal to C.

Referring back to FIG. 4, it is noted that the total series capacitance between input node IN 403 and output node OUT 405 is a discrete linear function of enable signals 407, also referred to as EN[0:N−1]. That is, the effective capacitance of adjustable floating capacitor 401 increases linearly in discrete steps from a very low value when enable signals 407 are all low, to a maximum capacitance value when enable signals 407 are all high.

Figure 6:
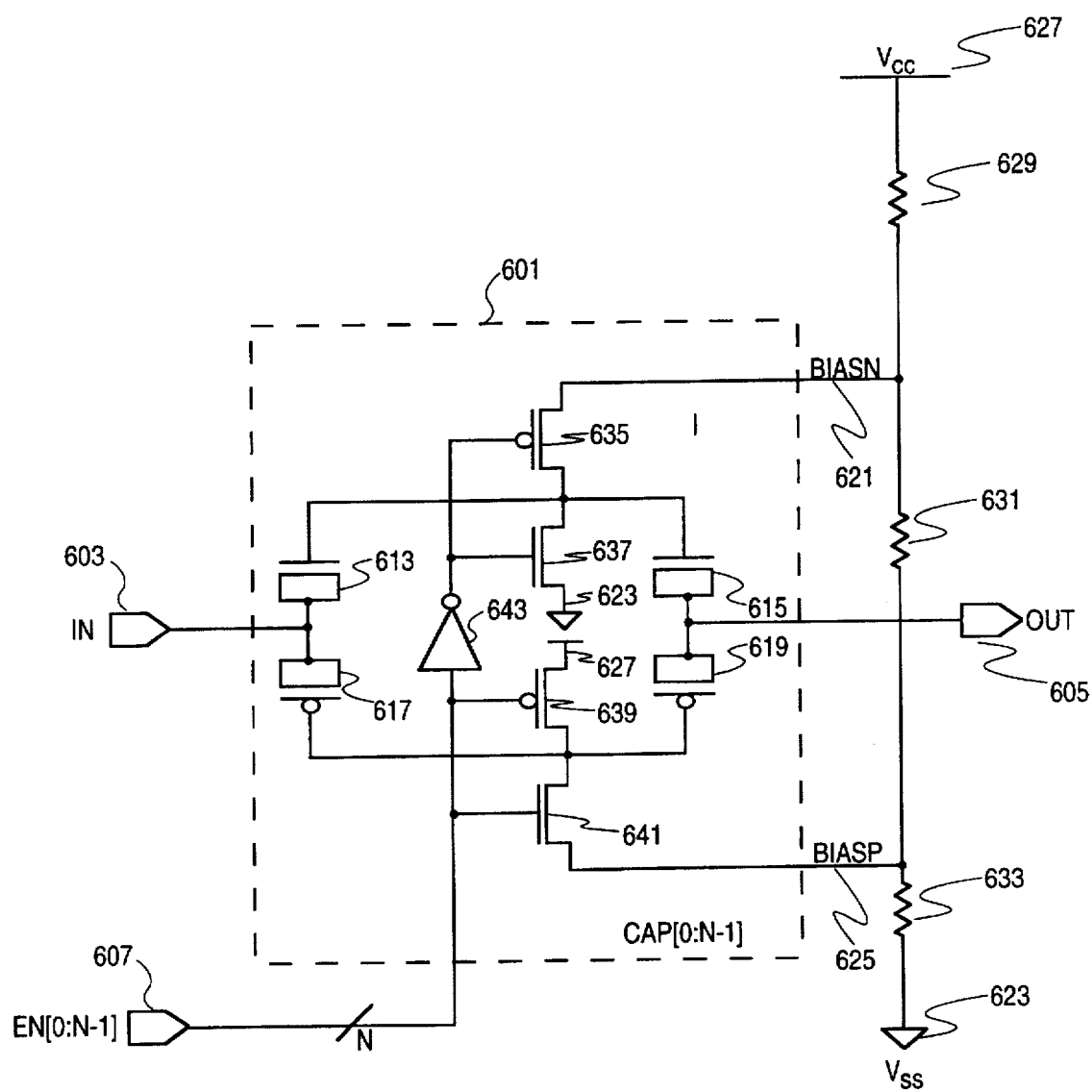
FIG. 6 is a schematic of another embodiment of a digitally-controlled adjustable floating capacitor in accordance with the teachings of the present invention.

FIG. 6 shows yet another embodiment of the present invention. Digitally-adjustable floating MOS capacitor 601 is similar to the embodiment shown in FIG. 4 with switches 409 and 411 implemented with simple MOS devices as shown in FIG. 6. Digitally-adjustable floating MOS capacitor 601 includes n-channel transistors 613 and 615 having commonly coupled gates. The source and drain of n-channel transistor 613 are coupled to input node IN 603, while the source and drain of n-channel transistor 615 are coupled to output node OUT 605. Also included in digitally-adjustable floating MOS capacitors 601 are p-channel transistors 617 and 619 having commonly coupled gates. The source and drain of p-channel transistor 617 are coupled to input node IN 603 while the source and drain of p-channel transistor 619 are coupled to the output node OUT 605.

A resistor voltage divider circuit including series coupled resistors 629, 631 and 633 is coupled between $V_{CC}$ 627 and $V_{SS}$ 623. The resistor voltage divider circuit shown in FIG. 6 produces the output bias voltages at nodes BIASN 621 and BIASP 625.

P-channel transistor 635 is coupled between the gates of n-channel transistors 613 and 615 and node BIASN 621. N-channel transistor 637 is coupled between the gates of n-channel transistor 613 and 615 and $V_{SS}$ 623. The gates of p-channel transistor 635 and n-channel transistor 637 are coupled to an output of inverter 643. The input of inverter 643 is coupled to receive one of the enable signals 607, also referred to as EN[0:N−1] in FIG. 6. P-channel transistor 639 is coupled between $V_{CC}$ 627 and the gates of p-channel transistors 617 and 619. N-channel transistor 641 is coupled between the gates of p-channel transistors 617 and 619 and node BIASP 625. The gates of p-channel transistor 639 and n-channel transistor 641 are coupled to receive one of the enable signals 607.

Similar to the digitally-adjustable floating MOS capacitor shown in FIG. 4, floating capacitor 601 also includes N floating capacitors, CAP[0:N−1], coupled in parallel. All N inputs of CAP[0:N−1] are coupled together to input node IN 603, while all N outputs of CAP[0:N−1] are coupled together to output node OUT 605. Each floating capacitor CAP[M] consists of four MOS devices, transistors 613, 615, 617 and 619 coupled as capacitors. For each individual capacitor, for example CAP[M], when a corresponding one of the enable signals 607, for example EN[M], is high, the gates of p-channel transistors 617 and 619 are coupled through n-channel transistor 641 to node BIASP 625. In addition, the gates of n-channel transistors 613 and 615 are coupled to node BIASN 621 through p-channel transistor 635. In this situation, the capacitance of capacitor CAP[M] is maximum.

In situations where one of the enable signals 607, for example EN[M], is low, the gates of p-channel transistors 617 and 619 are coupled to $V_{CC}$ 627 through p-channel transistor 639. The gates of n-channel transistors 613 and 615 are coupled to $V_{SS}$ 623 through n-channel transistor 637. In this situation, the capacitance of capacitor CAP[M] is minimal.

Therefore, in the foregoing detailed description, a method and an apparatus for providing an adjustable floating capacitance between a first node and a second node in an integrated circuit is described. The method and apparatus of the present invention has been described with reference to specific exemplary embodiments thereof. It will, however, be evident that various modifications and changes may be made thereto without departing from the broader spirit and scope of the present invention. The present specification and drawings are accordingly to be regarded as illustrative rather than restrictive.

What is claimed is:

1. An integrated circuit comprising:
   first and second transistors having commonly coupled gates, the drain and source of the first transistor coupled to a first node, the drain and source of the second transistor coupled to a second node; and
   a switching circuit coupled to the gates of the first and second transistors, a first potential and a second potential, the switching circuit alternatively coupling the gates of the first and second transistors to the first potential or the second potential in response to an enable signal such that the integrated circuit alternately provides a first capacitance or a second capacitance respectively between the first and second nodes.

2. The integrated circuit described in claim 1 further comprising third and fourth transistors having commonly coupled gates, the drain and source of the third transistor coupled to the first node, the drain and source of the fourth transistor coupled to the second node, the switching circuit coupled to the gates of the third and fourth transistors, a third potential and a fourth potential, the switching circuit alternatively coupling the gates of the third and fourth transistors to the third potential or the fourth potential in response to the enable signal such that the integrated circuit alternately provides a third capacitance or a fourth capacitance respectively between the first and second nodes in response to the enable signal.

3. The integrated circuit described in claim 2 wherein the first and second transistors are n-channel transistors and the third and fourth transistors are p-channel transistors.

4. The integrated circuit described in claim 1 further comprising a resistor voltage divider circuit, the resistor voltage divider circuit providing the first potential.

5. The integrated circuit described in claim 2 further comprising a resistor voltage divider circuit, the resistor voltage divider circuit providing the first and third potentials.

6. The integrated circuit described in claim 5 wherein the resistor voltage divider circuit comprises first, second and third resistors coupled in series between the fourth and second potentials, wherein the first potential is provided between the first and second resistors, and the third potential is provided between the second and third resistors.

7. The integrated circuit described in claim 2 wherein the switching circuit comprises:
   a fifth transistor coupled between the first potential and the gates of the first and second transistors;
   a sixth transistor coupled between the second potential and the gates of the first and second transistors;
   a seventh transistor coupled between the fourth potential and the gates of the third and fourth transistors wherein the enable signal is coupled to a gate of the seventh transistor;
   an eighth transistor coupled between the third potential and the gates of the third and fourth transistors wherein the enable signal is coupled to a gate of the eighth transistor; and
   an inverter having an inverter input coupled to receive the enable signal, the inverter having an inverter output coupled to the gates of the fifth and sixth transistors.

8. The integrated circuit described in claim 7 wherein the fifth and seventh transistors are p-channel transistors and the sixth and eighth transistors are n-channel transistors.

9. The integrated circuit described in claim 2 wherein the second potential is $V_{SS}$, the fourth potential is $V_{CC}$ and the first and third potentials are between the second and fourth potentials.

10. The integrated circuit described in claim 1 wherein the first capacitance is greater than the second capacitance.

11. The integrated circuit described in claim 2 wherein the third capacitance is greater than the fourth capacitance.

12. In an integrated circuit, a method for providing an adjustable floating capacitance between a first node and a second node in an integrated circuit, the method comprising the steps of:
    biasing the gates of first and second transistors to a first potential to provide a first capacitance between the first and second nodes, wherein the first transistor drain and source are coupled to the first node, the second transistor drain and source are coupled to the second node and the gates of the first and second transistors are coupled together; and
    biasing the gates of the first and second transistors to a second potential to provide a second capacitance between the first and second nodes.

13. The method described in claim 12 including the additional steps of:
    biasing the gates of the third and fourth transistors to a third potential to provide a third capacitance between the first and second nodes, wherein the third transistor drain and source are coupled to the first node, the fourth transistor drain and source are coupled to the second node and the gates of the third and fourth transistors are coupled together; and
    biasing the gates of the third and fourth transistors to a fourth potential to provide a fourth capacitance between the first and second nodes.

14. The method described in claim 13 wherein the step of biasing the gates of the first and second transistors to the first potential includes the step of providing the first potential with a resistor voltage divider circuit coupled between the fourth and second potentials.

15. The method described in claim 13 wherein the step of biasing the gates of the third and fourth transistors to the third potential includes the step of providing the third potential with a resistor voltage divider circuit coupled between the fourth and second potentials.

16. The method described in claim 12 wherein the first capacitance is greater than the second capacitance.

17. The method described in claim 13 wherein the third capacitance is greater than the fourth capacitance.

18. An adjustable floating MOS capacitor providing an adjustable capacitance between a first node and a second node in an integrated circuit, the adjustable floating MOS capacitor comprising:
    a first n-channel transistor, the first n-channel transistor source and drain coupled to the first node;
    a second n-channel transistor, the second n-channel transistor source and drain coupled to the second node, the second n-channel transistor gate coupled to the first n-channel transistor gate;
    a first p-channel transistor, the first p-channel transistor source and drain coupled to the first node;
    a second p-channel transistor, the second p-channel transistor source and drain coupled to the second node, the second p-channel transistor gate coupled to the first p-channel transistor gate;

a resistor voltage divider circuit coupled between a fourth potential and a second potential, the resistor voltage divider circuit configured to provide a first and a third potential; and a switching circuit coupled to the gates of the first and second n-channel transistors, the first potential and the second potential, the switching circuit alternatively coupling the gates of the first and second n-channel transistors to the first potential or the second potential in response to an enable signal, the switching circuit further coupled to the gates of the first and second p-channel transistors, the third potential and the fourth potential, the switching circuit alternatively coupling the gates of the first and second p-channel transistors to the third potential or the fourth potential in response to the enable signal.

19. The adjustable floating MOS capacitor described in claim 18 wherein the resistor voltage, divider circuit comprises series coupled first, second and third resistors wherein the first potential is provided between the first and second resistors and the third potential is provided between the second and third resistors.

20. The adjustable floating MOS capacitor described in claim 18 wherein the switching circuit comprises:

a third p-channel transistor coupled between the first potential and the gates of the first and second n-channel transistors;

a third n-channel transistor coupled between the second potential and the gates of the first and second n-channel transistors;

a fourth p-channel transistor coupled between the fourth potential and the gates of the first and second p-channel transistors wherein the enable signal is coupled to a gate of the fourth p-channel transistor;

a fourth n-channel transistor coupled between the third potential and the gates of the first and second n-channel transistors wherein the enable signal is coupled to a gate of the fourth n-channel transistor; and an inverter having an input coupled to receive the enable signal, the inverter having an output coupled to the gates of the third p-channel and n-channel transistors.

\* \* \* \* \*

UNITED STATES PATENT AND TRADEMARK OFFICE
CERTIFICATE OF CORRECTION

PATENT NO. : 5,714,907
DATED : February 3, 1998
INVENTOR(S) : Mel Bazes

It is certified that error appears in the above-identified patent and that said Letters Patent is hereby corrected as shown below:

In column 5 at line 48 delete "mils" and insert --rails--

Signed and Sealed this

First Day of September, 1998

Attest:

BRUCE LEHMAN

*Attesting Officer*        Commissioner of Patents and Trademarks